United States Patent [19]

Nakatani et al.

[11] Patent Number: 4,486,232

[45] Date of Patent: Dec. 4, 1984

[54] ELECTRODE MATERIAL FOR SEMI-CONDUCTOR DEVICES

[75] Inventors: Mitsuo Nakatani, Yokohama; Haruhiko Matsuyama, Hiratsuka; Masaaki Okunaka; Hitoshi Yokono, both of Fujisawa; Tokio Isogai, Katsuta; Tadashi Saitoh, Tokyo; Sumiyuki Midorikawa, Hitachi, all of Japan

[73] Assignee: Hitachi, Ltd., Tokyo, Japan

[21] Appl. No.: 523,857

[22] Filed: Aug. 17, 1983

[30] Foreign Application Priority Data

Aug. 20, 1982 [JP] Japan .................... 57-143202

[51] Int. Cl.$^3$ ............................................. H01B 1/02
[52] U.S. Cl. ........................................ 75/252; 252/514
[58] Field of Search .................. 75/252, 251; 252/514

[56] References Cited

U.S. PATENT DOCUMENTS

| | | | |
|---|---|---|---|
| 3,450,545 | 6/1969 | Ballard et al. | 75/252 |
| 3,951,872 | 4/1976 | Neely | 252/514 |
| 3,957,453 | 5/1976 | Hässler et al. | 252/514 |
| 4,219,448 | 8/1980 | Ross | 75/252 |

Primary Examiner—W. Stallard
Attorney, Agent, or Firm—Antonelli, Terry & Wands

[57] ABSTRACT

An electrode material for semi-conductor device such as solar cells comprises Ag powders, at least one metal of zirconium, hafnium, vanadium, niobium, and tantalum, an organic binder, and an organic solvent, and, if necessary, glass, Pd powders and Pt powders.

The electrodes are prepared from the electrode material by printing, drying and firing at a low temperature and have a low contact resistance without any junction breakage or increase in leak current.

3 Claims, 1 Drawing Figure

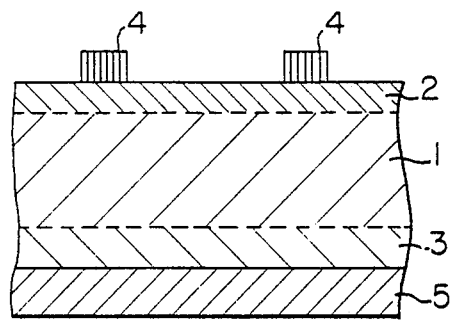

ELECTRODE MATERIAL FOR SEMI-CONDUCTOR DEVICES

BACKGROUND OF THE INVENTION

1. Field of the Invention

This invention relates to an electrode material for semi-conductor devices, and particularly to an electrode material suitable for the production of semiconductor elements having an electrode in a relatively rough pattern, such as solar cells, etc.

2. Description of the Prior Art

Typical structure of a solar cell as a semi-conductor element is shown in the accompanying drawing, where light recipient side electrodes 4 and a back side electrode 5 are formed on the light recipient side and the back side, respectively, of a Si substrate 1 having an $n^+$ layer 2 and a $p^+$ layer in an $n^+/p/p^+$ junction, and generally antireflective layers, etc. can be further provided on it.

Recently, an important task of the solar cell has been a reduction of production cost, and use of a low cost plating process or printing process has been investigated in place of the conventional vacuum vapor deposition process for forming the light recipient side electrode 4 and the back side electrode 5 in the FIGURE and above all the printing process has been extensively investigated owing to easy automation and high productivity. According to the printing process, a pasty mixture of metal powders, glass powders, etc. kneaded with an organic binder and an organic solvent (which will be hereinafter referred to as "electroconductive paste") is applied to a substrate by screen printing, etc., and fired, where generally silver powders are used as the metal powders. Many kinds of such electroconductive paste are commercially available for forming electrodes of solar cell or for forming a thick film circuit.

On the other hand, requirements for forming electrode of solar cell are high bonding strength of electrode, low contact resistance with silicon, no breakthrough of diffusion layer (small leak current), etc.

However, as a result of investigation of various, commercially available electroconductive pastes based on Ag or Ag-Pd, the present inventors have found the following problem when any of the electroconductive pastes is applied to silicon wafers with junctions as shown in FIGURE by printing, dried and fired. That is, a barrier is formed between the silicon wafer and the electrode in the case of an electroconductive paste based on Ag or Ag-Pd for forming a thick film circuit, resulting in an increase in contact resistance. Firing at a relatively high temperature damages the junction, resulting in an increase in leak current. Some of the electroconductive pastes based on Ag for forming a solar cell electrode hardly forms a barrier between the silicon wafer and the electrode, but the contact resistances are all high. Investigation of current-voltage characteristics of a solar cell at light irradiation shows a small fill factor, and no efficient solar cells have not been available.

High firing temperature tends to lower the contact resistance, but the leak current is increased. Thus, it has been very difficult to form electrodes with a low contact resistance from the conventional electroconductive pastes as mentioned above without any damage of junctions.

SUMMARY OF THE INVENTION

An object of the present invention is to provide a very useful electrode material for semi-conductor devices such as solar cells, etc.

According to the present invention, an electrode material comprises silver (Ag) powders, at least one of zirconium (Zr), hafnium (Hf), vanadium (V), niobium (Nb), and tantalum (Ta), an organic binder and an organic solvent, and can further contain glass powder or palladium (Pd) powders.

The present electrode material differs from the conventional electroconductive paste in that the present electrode material contains at least one metal of Zr, Hf, V, Nb and Ta. The present inventors have found that an electrode with a very low contact resistance to a substrate such as silicon, etc. can be formed from the present electrode material containing at least one of the said metals by printing and firing even at a relatively low temperature having no risk of junction breakage ($<750°$ C.).

The reasons why such an excellent electrode can be formed from the present electrode material, as compared with the conventional electroconductive paste seem as follows.

When the conventional electroconductive paste is applied to, for example, a silicon substrate by printing and fired, a thin insulating silicon oxide layer will be formed on the silicon surface by the oxygen contained in the firing atmosphere. In the case of an electroconductive paste containing a low melting glass based on lead oxide, such a silicon oxide layer can be also formed by reaction of lead oxide with silicon. It seems that a silicon oxide layer formed on the silicon surface will much increase the contact resistance between the fired electrode and silicon substrate.

On the other hand, in the case of the present electrode material, it seems that a silicon oxide layer will be also formed in the same manner as above, but the metal contained in the present electrode material, that is, Zr, Hf, V, Nb, and/or Ta reacts with the silicon oxide layer, resulting in reduction of silicon oxide or formation of silicide compounds of these metals, and consequently it seems that the contact resistance between the electrode and the silicon substrate will be much lowered.

Components of the present electrode material will be further described below:

The same Ag powder, organic binder and organic solvent as used in the conventional electroconductive paste can be used as the components of the present electrode material.

Ag powders having particle sizes of less than 1 μm. cellulose-based compounds and polymethacrylate-based compounds as the organic binder, and polyhydric alcohol as the organic solvent can be particularly preferably used.

It is preferable to use metals of Zr, Hf, V, Nb and Ta in a powdery state, but powders of these metals have a high activity, and thus it is preferable to use the stabilized powders, that is, powders having a thin oxide layer on the powder surface. Zr, Hf, V, Nb, and Ta can be used alone or in a mixture of two or more of them. It is also possible to use alloy powders of two or more of them, or Ag powder with a coating of one or more of these metals.

It is not essential for the present electrode material to contain glass, but glass can improve the bonding strength of formed electrode to the semi-conductor element, when contained, and can also improve the resistance of electrode to soldering. Thus, it is rather preferable for the present electrode material to contain glass particularly when solar cell electrodes are formed. The species of glass for use in the present invention are not particularly limited.

Furthermore, the present electrode material can contain Pd powder, whereby the resistance of the formed electrode to soldering can be further improved. Furthermore, the present electrode material can contain Pt powders, whereby the bonding strength of the formed electrode can be improved.

When the present electrode material is used particularly for forming solar cell electrodes, it is preferable to use 0.5-30 parts by weight of at least one metal of Zr, Hf, V, Nb and Ta per 100 parts by weight of Ag powders. Below 0.5 parts by weight, the contact resistance of formed electrode to silicon substrate is increased, whereas above 30 parts by weight, the resistance of formed electrode is rather increased, resulting in possible reduction in the solar cell efficiency.

BRIEF DESCRIPTION OF THE DRAWING

The single FIGURE is a cross-sectional view showing a typical structure of solar cell, wherein 1 is a silicon substrate, 2 is an $n^+$ layer, 3 is a $p^+$ layer, 4 is a light recipient side electrode, and 5 is a back side electrode.

PREFERRED EMBODIMENTS OF THE INVENTION

The present invention will be described in detail below, referring to Examples.

EXAMPLE 1

10 g of Ag powders having particle sizes of less than 1 μm, 0.5-30 parts by weight of surface-stabilized Zr powders having particle sizes of 2 μm per 100 parts by weight of the Ag powders, and 0.5 g of glass frits based on $PbO-B_2O_3-SiO_2$ were weighed out, and thoroughly kneaded while adding thereto a viscous solution of 10 parts by weight of ethyl cellulose in 90 parts by weight of α-terpineol to prepare a pasty electrode material having a viscosity of about 200 poises (share rate of 100 $sec^{-1}$).

As a junction-formed silicon substrate for solar cells, a p-type silicon substrate (round wafer, 3 inches in diameter, specific resistance 1-5 Ω·cm) with an $n^+$ layer, 0.3-0.5 μm deep, formed by ion implantation (specific resistance $1.5 \times 10^{-3}$ Ω·cm) on one side and a $p^+$ layer, 1-2 μm deep, by Al diffusion on the other side, was used.

Said pasty electrode material was applied by screen printing onto the $n^+$ layer of the junction-formed silicon substrate in a comb pattern and onto the $p^+$ layer overall, and dried at 150° C. for 10 minutes.

Then, the substrate was fired at 600° C. for 10 minutes in a nitrogen gas atmosphere containing 50 ppm of oxygen. The thus prepared solar cell was investigated for the current-voltage characteristics (I–V characteristics) that is, contact resistance of electrode, leak current at the reverse bias voltage (1V), fill factor (F.F.), open circuit voltage (Voc) and short circuit current (Isc). The results are shown in Table 1.

As is evident from Table 1, solar cells using the present electrode materials containing Zr powders have a considerably low contact resistance and larger F.F. and Isc and consequently largely increased efficiency as compared with Comparative Example 1 using no Zr powders. The leak currents are all on the order of $10^{-6}$ $A/cm^2$, and thus there are no problems at all.

Thus, it has been found that the present electrode material has a sufficiently low contact resistance, when fired even at a relatively low temperature of 600° C., and also has no increase in leak current in spite of the $n^+$ layer being as shallow as 0.3-0.5 μm, and is very ditinguished as compared with the conventional electroconductive paste.

TABLE 1

| | Component (parts by weight) | | | Solar cell characteristics (AM · 1, 28° C.) | | | | |
|---|---|---|---|---|---|---|---|---|
| No. | Ag powder | Zr powder | Glass frit | Contact resistance | Leak current | Voc (V) | Isc (A) | F.F. |
| 1 | 10 | 0.05 | 0.5 | 0.31 ($\Omega \cdot cm^2$) | $4 \times 10^{-6}$ ($A/cm^2$) | 0.58 | 1.0 | 0.61 |
| 2 | 10 | 0.1 | 0.5 | 0.16 | $4 \times 10^{-6}$ | 0.58 | 1.1 | 0.71 |
| 3 | 10 | 0.5 | 0.5 | 0.05 | $4 \times 10^{-6}$ | 0.58 | 1.0 | 0.77 |
| 4 | 10 | 1 | 0.5 | 0.04 | $3 \times 10^{-6}$ | 0.58 | 1.1 | 0.78 |
| 5 | 10 | 2 | 0.5 | 0.04 | $4 \times 10^{-6}$ | 0.58 | 1.1 | 0.78 |
| 6 | 10 | 3 | 0.5 | 0.03 | $5 \times 10^{-6}$ | 0.58 | 1.0 | 0.76 |
| Comp. Ex. 1 | 10 | 0 | 0.5 | 1.2 | $3 \times 10^{-6}$ | 0.58 | 0.4 | 0.27 |

EXAMPLE 2

In this example, the present electrode materials containing Hf, V, Nb and Ta as the metals are shown.

Metal powders of Hf, V, Nb and Ta with a thin oxide layer on the powder surface, Ag powders having particle sizes of less than 1 μm and glass frits (based on lead borosilicate, zinc borosilicate and phosphate) were weighed out in various combinations as shown in Table 2, and thoroughly kneaded while adding thereto a viscous solution of 40 parts by weight of polyisobutyl methacrylate and 0.5 parts by weight of a dispersant in 60 parts by weight of α-terpineol to prepare various pasty electrode materials having a viscosity of about 200 poises (share rate 100 $sec^{-1}$).

The thus prepared electrode materials were applied to the surfaces of the same junction-formed silicon substrates by screen printing, dried at 150° C. for 10 minutes, and fired at 600° C. for 10 minutes in a nitrogen gas atmosphere containing 5 ppm of oxygen. The thus prepared solar cells were investigated for their characteristics in the same manner as in Example 1, and the results are shown in Table 2 together with the components of the electrode materials.

As is evident from Table 2, the present electrode materials containing Hf, V, Nb and Ta have a low contact resistance, and larger F.F. and Isc, and consequently considerably improved efficiency, as compared with Comparative Example 2 using no such metal powders. The leak current is all on the order of $10^{-6}$ A/cm$^2$ and there are no problems at all.

Thus, it has been found that the present electrode materials shown in Example 2 have very distinguished effects than the conventional electroconductive paste.

TABLE 2

| No. | Components (parts by weight) | | | Solar cell characteristics (AM - 1, 28° C.) | | | | |
|---|---|---|---|---|---|---|---|---|
| | Ag powders | Metal powders | Glass frits | Contact resistance | Leak current | Voc (V) | Isc (A) | F.F. |
| 7 | 10 | Hf 0.5 | Lead borosilicate 0.5 | 0.04 (A/cm$^2$) | $4 \times 10^{-6}$ | 0.58 | 1.0 | 0.76 |
| 8 | 10 | V 0.5 | Lead borosilicate 0.5 | 0.06 | $4 \times 10^{-6}$ | 0.58 | 1.0 | 0.76 |
| 9 | 10 | Nb 0.5 | Lead borosilicate 0.5 | 0.09 | $6 \times 10^{-6}$ | 0.58 | 1.1 | 0.74 |
| 10 | 10 | Ta 0.5 | Lead borosilicate 0.5 | 0.12 | $7 \times 10^{-6}$ | 0.58 | 1.0 | 0.71 |
| 11 | 10 | V 0.5 | Zinc borosilicate 0.5 | 0.05 | $6 \times 10^{-6}$ | 0.58 | 1.1 | 0.73 |
| 12 | 10 | Nb 0.5 | Lead borosilicate ...0.3 Phosphate...0.2 | 0.07 | $5 \times 10^{-6}$ | 0.58 | 1.1 | 0.75 |
| 13 | 10 | V...0.25 Ta...0.25 | Lead borosilicate 0.5 | 0.10 | $5 \times 10^{-6}$ | 0.58 | 1.0 | 0.74 |
| Comp. Ex. 2 | 10 | 0 | Zinc borosilicate 0.5 | 1.6 | $4 \times 10^{-6}$ | 0.58 | 0.4 | 0.22 |

As described above, the present electrode material is an epock-making material capable of forming an electrode with a low contact resistance without any junction breakage or increase in leak current to semi-conductor elements with shallow junction even at a relatively low firing temperature. Thus, a very highly efficient solar cell can be prepared by using the present electrode material is forming electrodes of solar cells, as compared with the conventional electroconductive paste.

The present electrode material can be applied to a substrate by printing, and thus electrodes can be formed at a low cost with a high productivity. Thus, the present electrode material is industrially very useful. Furthermore the present electrode material can be also used in forming light-recipient elements other than the solar cell and also forming electrodes for other semi-conductor devices.

What is claimed is:

1. An electrode material for semi-conductor device, which comprises Ag powders, at least one metal of zirconium, hafnium, vanadium, niobium, and tantalum, an organic binder and an organic solvent.

2. An electrode material according to claim 1, where at least one of glass, Pd powders and Pt powders is further contained.

3. An electrode material according to claim 1 or 2, wherein 0.5-30 parts by weight of at least one metal of the zirconium, hafnium, vanadium, niobium and tantalum is contained per 100 parts by weight of the Ag powders.

* * * * *